United States Patent [19]

Hijiya et al.

[11] Patent Number: 4,491,859
[45] Date of Patent: Jan. 1, 1985

[54] SEMICONDUCTOR NON-VOLATILE MEMORY DEVICE

[75] Inventors: Shinpei Hijiya, Sagamihara; Takashi Ito, Kawasaki, both of Japan

[73] Assignee: Fujitsu Limited, Kawasaki, Japan

[21] Appl. No.: 526,219

[22] Filed: Aug. 25, 1983

Related U.S. Application Data

[63] Continuation of Ser. No. 160,505, Jun. 18, 1980, abandoned.

[30] Foreign Application Priority Data

Jun. 18, 1979 [JP] Japan .................................. 54-76569
Jul. 28, 1979 [JP] Japan .................................. 54-96421

[51] Int. Cl.³ .................... H01L 27/02; H01L 29/78; H01L 27/12; G11C 11/40
[52] U.S. Cl. .......................................... 357/41; 357/4; 357/54; 365/185; 357/23
[58] Field of Search .................. 357/4, 23 VT, 41, 54, 357/23 TF; 365/185

[56] References Cited

U.S. PATENT DOCUMENTS

| | | | |
|---|---|---|---|
| 3,744,036 | 7/1973 | Frohman-Bentchkowsky | 357/23 VT |
| 3,755,721 | 8/1973 | Frohman-Bentchkowsky | 357/43 |
| 3,893,085 | 7/1975 | Hansen | 357/23 VT |
| 4,233,616 | 11/1980 | Kyomasu et al. | 357/23 VT |
| 4,247,859 | 1/1981 | Rai-Choudhury et al. | 357/4 |
| 4,247,861 | 1/1981 | Hsu et al. | 357/23 VT |

Primary Examiner—Gene M. Munson
Attorney, Agent, or Firm—Staas & Halsey

[57] ABSTRACT

A semiconductor non-volatile memory device comprising: (a) memory transistor which has: a first source, drain, and channel regions; a first insulation film formed above the first channel region; a floating gate formed above the first insulation film; and a first impurity region which is formed contiguous with the first drain region adjacent to an end of the floating gate, and which has a conductivity type opposite to that of the first drain region; (b) a switching transistor which has: second source, drain, and channel regions, a second insulation film formed above the second channel region, and a gate electrode formed above the second insulation film; (c) wiring means which connects the first impurity region of the memory transistor to the second drain region of the switching transistor. When information is being written, the switching transistor keeps the first impurity region in a ground state, and when information is being read, the switching transistor keeps the impurity region in an electrically floating state.

14 Claims, 11 Drawing Figures

SEMICONDUCTOR NON-VOLATILE MEMORY DEVICE

This application is a continuation, of application Ser. No. 160,505, filed 18 June 1980, now abandoned.

BACKGROUND OF THE INVENTION

The present invention relates to a semiconductor non-volatile memory device of the type which has a floating gate, to capture electric charge through a gate insulation film, and which utilizes, as a memory function, the change in the gate threshold voltage caused by the presence or absence of electric charge, or by the change of the polarity of the stored electric charge.

In general, semiconductor non-volatile memory devices can be roughly divided into those having an electrically conductive layer which accumulates an electric charge in the gate insulation film, (i.e., those of the floating gate type), and those which utilize the trap formed on the interface of dissimilar insulation films as a gate insulation film, such as those of the MNOS (metal nitride oxide semiconductor) type or those of the MAOS (metal alumina oxide semiconductor) type. According to these memory devices, the electric charge is accumulated in the floating gate or in the trap to utilize the gate threshold voltage as a memory function, which changes depending upon the presence or absence of the accumulated charge or depending upon the polarity of the electric charge.

In memory devices of the floating gate type, the electric charge is avalanche-injected, i.e., hot carriers produced by an avalanche breakdown are injected. In memory devices of the MNOS type, the electric charge is injected by utilizing the tunnel effect.

The conventional devices, however, have various defects. The most serious defect is that an extremely large voltage of reverse polarity is required during the so-called writing mode to inject the electric charge into the floating gate or into the trap, and accordingly, a special power source is required to write information.

The specification of Japanese Pat. No. 13142/80 discloses a memory device of the floating gate type which permits the avalanche breakdown to easily take place in the vicinity of the drain, to cope with the above-mentioned defect. Further, although the objects, functions and effects are different, the specification of U.S. Pat. No. 3,755,721 discloses a memory device of a similar construction.

With the conventional devices disclosed in the above-mentioned specifications, however, the same drain circuit operates when information is written or erased and when information is read. Therefore, even if the avalanche breakdown voltage is reduced during the writing mode, hot carriers are also generated in small amounts during the reading mode and are injected into the floating gate, whereby the gate threshold voltage is varied and unnecessary information is written. Accordingly, the writing and erasing voltages cannot be sufficiently reduced. If this reading problem can be solved, the avalanche breakdown voltage can be decreased to about 5 volts, by increasing the concentration in the P and N layers to a particular level. If the concentration is further increased, however, the tunnel effect occurs, which makes it difficult to decrease the avalanche breakdown voltage below 5 volts.

With the memory devices of the MNOS type which utilize the trap in the insulation film, the writing and erasing voltages can be decreased by reducing the thickness of the insulation film. When the thickness of the insulation film is reduced, however, the formation storage characteristics deteriorate, and carriers are injected during the reading mode. Therefore, the writing and erasing voltages cannot be sufficiently decreased.

SUMMARY OF THE INVENTION

An object of the present invention, therefore, is to provide a semiconductor non-volatile memory device which inhibits the occurrence of undesirable writing during the reading mode, despite the fact that the avalanche breakdown voltage in the drain junction is reduced.

Another object of the present invention is to provide a semiconductor non-volatile memory device of a novel construction which is capable of greatly reducing the writing and erasing voltages, as compared with the voltages required in the conventional counterparts, while reducing the avalanche breakdown voltage in the drain junction below 5 volts.

According to the present invention, there is provided a semiconductor non-volatile memory device comprising: (a) a memory transistor which has: a first source region and a first drain region and a first channel which is formed between the first source and drain regions in a substrate; a first insulation film formed on the first channel region; a floating gate formed on the first insulation film; and a first impurity region which is formed contiguous with the first drain region adjacent to an end of the floating gate, and which has conductivity type opposite to that of the first drain region; (b) a switching transistor which has: a second source region, a second drain region and a second channel region which is formed between the second source and drain regions in a substrate, a second insulation film formed on the second channel region, and a gate electrode formed on the second insulation film; and (c) wiring means which connects the first impurity region of the memory transistor to the second drain region of the switching transistor, wherein when information is being written, the switching transistor keeps the first impurity region in a grounded state and when information is being read, the switching transistor keeps the first impurity region in an electrically floating state.

Further features and advantages of the present invention will become apparent from the ensuing description with reference to the accompanying drawings to which, however, the scope of the invention is in no way limited.

DESCRIPTION OF THE PREFERRED EMBODIMENTS

Figures 1A, 1B:
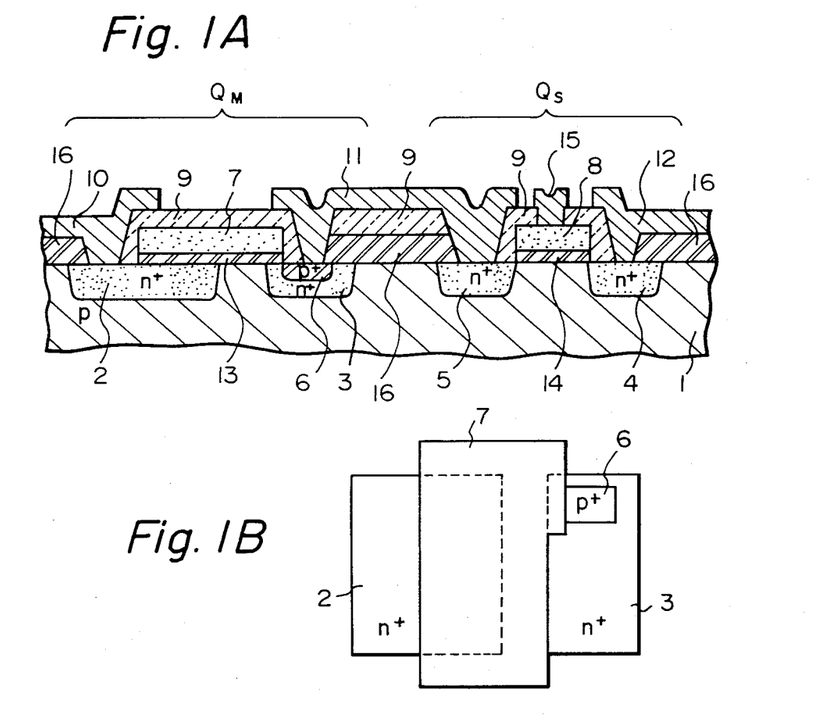
FIGS. 1A and 1B are a cross-sectional view and a plan view, respectively, illustrating major portions of a semiconductor non-volatile memory device according to a first embodiment of the present invention.

FIG. 1A is a cross-sectional side view illustrating major portions in an embodiment of the present invention, in which reference numeral 1 denotes a p-type silicon semiconductor substrate having an impurity concentration of about $10^{15}$ to $10^{16}/cm^3$, 2 represents an n+-type source region having an impurity concentration of, for example, about $10^{20}/cm^3$, 3 denotes an n+-type drain region having an impurity concentration of, for example, about $10^{17}/cm^3$, and 4 denotes an n+-type source region; 5 denotes an n+-type drain region, 6 denotes a p+-type region, 7 denotes a floating gate and 8 denotes a gate electrode; 9 denotes an insulation film composed of a phosphosilicate glass (PSG) or the like, 10 denotes a source electrode wiring composed, for example, of aluminum, 11 denotes an aluminum wiring for connecting the p+-type region 6 to the drain region 5, and 12 denotes a source electrode wiring composed, for example, of aluminum; 13 denotes a gate insulation film composed of a thermally nitrified film which is a first layer of a memory transistor, 14 denotes a gate insulation film composed of silicon dioxide in a switching transistor, 15 denotes a gate wiring composed of aluminum and 16 denotes a field insulation film composed of a silicon dioxide; $Q_M$ denotes a memory transistor and $Q_S$ denotes a switching transistor.

According to this embodiment, the impurity concentration in the p+-type region 6 should be greater than that of the substrate 1, and is selected, for example, to be about $10^{20}/cm^3$. This enables the breakdown voltage in a pn junction between the drain region 3 and the p+-type region 6 to be about 5 volts. Further, the thickness of the gate insulation film 13 ranges from 50 to 60 angstroms.

FIG. 1B is a plan view for illustrating the p+-type region 6 which is formed in the drain region 3. As will be obvious from FIG. 1B, the p+-type region 6 is completely surrounded by the drain region 3, and a pn junction surface facing the source region 2 is placed beneath or superposed on the end surface of the floating gate 7.

Figure 2:
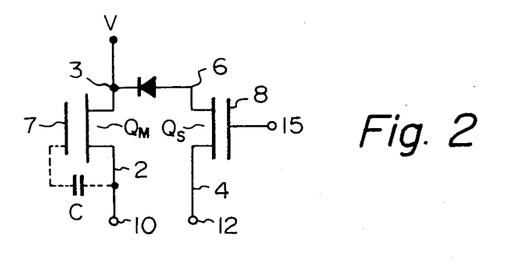
FIG. 2 illustrates an equivalent electric circuit of the device of FIGS. 1A and 1B.

FIG. 2 illustrates an electrically equivalent circuit of the first embodiment of the present invention illustrated in FIGS. 1A and 1B, wherein the reference numerals represent the same portions as those of FIGS. 1A and 1B.

The following is an explanation of the operation of the first embodiment of the present invention with reference to FIGS. 1A, 1B and 2. The source region 4 of the switching transistor $Q_S$ is always grounded. When information is to be written or erased, a positive voltage is applied to the gate electrode 8 of the transistor $Q_S$ to render it conductive. A breakdown voltage is applied to the drain region 3 of the memory transistor $Q_M$. When the transistor $Q_S$ is rendered conductive, therefore, the voltage is applied to the pn junction which is formed between the drain region 3 and the p+-type region 6. When the voltage applied to the drain region 3 is raised to, for example, 5 volts, avalanche breakdown takes place in the pn junction. In this case, if the source region 2 of the transistor $Q_M$ is maintained at a positive potential, the floating gate 7 is also maintained at a positive potential by the capacitance C between the gate 7 and the source region 2, whereby hot electrons generated by the avalanche breakdown are injected into the floating gate 7. Therefore, the channel region of the transistor $Q_M$ assumes the p-type, i.e. is rendered non-conductive, so that information is written. When the source region 2 of the transistor $Q_M$ is maintained at ground potential, the floating gate 7 is reduced to ground potential, whereby hot holes are injected from the region of avalanche breakdown into the floating gate 7, and the channel region of the transistor $Q_M$ is inverted into the n-type, i.e., is rendered conductive to erase information. To read information, ground potential is applied to the gate electrode 8 of the transistor $Q_S$, to render transistor $Q_S$ non-conductive. Therefore, the positive voltage applied to the drain region 3 is not applied to the pn junction formed between the drain region 3 and the p+-type region 6, and no avalanche breakdown takes place. In this case, if the source region 2 of the transistor $Q_M$ is kept at ground potential, the on or off state of the transistor $Q_M$ is read when the positive potential is applied to the drain region 3.

Figure 3:
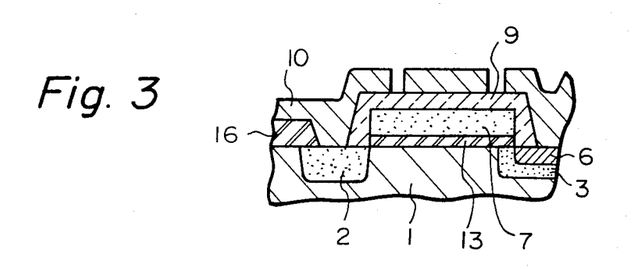
FIG. 3 is a cross-sectional view illustrating major portions of the device according to a modified embodiment of the present invention.

Although the above-mentioned embodiment employs a thermally nitrified film as a gate insulation film of the memory transistor $Q_M$, the gate insulation may of course be made of any other type of insulation film. Further, although the source electrode is used as a control gate of the memory transistor $Q_M$, control may alternatively be provided in the form of a control gate which is formed on the floating gate via an insulation film, as illuatrated in FIG. 3. When the memory device is of the type in which information can be erased by ultraviolet rays, the control gate may be eliminated. Moreover, a variety of modifications can be made to the control gate.

Figure 4A:
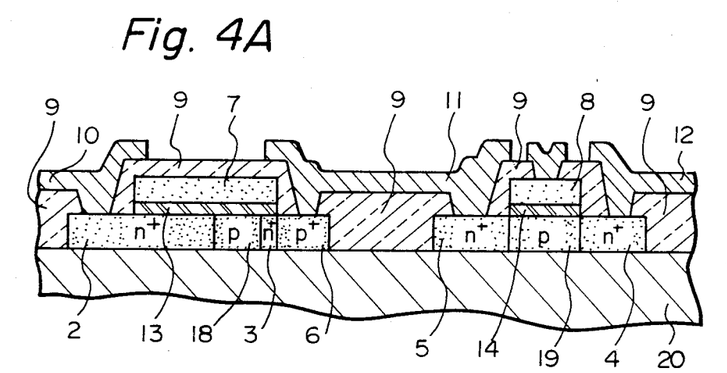
FIGS. 4A and 4B are a cross-sectional view and a plan view, respectively, of the device according to a second embodiment of the present invention.
Figure 4B:
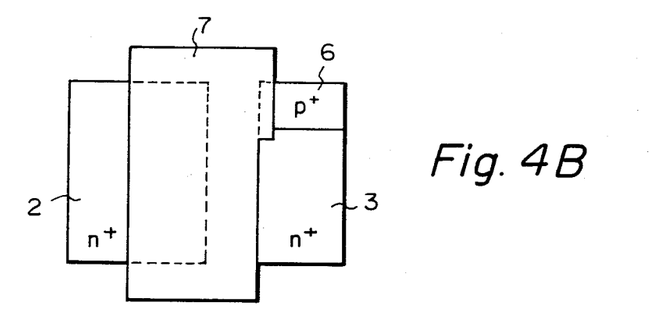

FIGS. 4A and 4B are a cross-sectional side view and a plan view, respectively, illustrating major portions of the device according to a second embodiment of the present invention. The device according to this embodiment is of a so-called SOS (silicon on sapphire) type, in which a substrate 20 is composed of a single crystalline insulation plate such as of $\gamma$-Al$_2$O$_3$, $\alpha$-Al$_2$O$_3$ or spinel. The same portions as illustrated with reference to FIGS. 1A and 1B are indicated by the same symbols or numerals. The device of this embodiment operates in much the same manner as that of the first embodiment. Reference numerals 18 and 19 denote p-type regions which serve as channel regions.

Figure 5A:
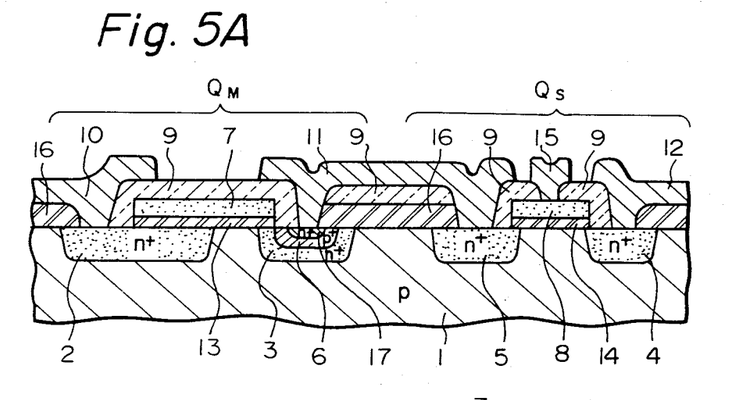
FIGS. 5A and 5B are a cross-sectional view and a plan view, respectively, of the device according to a third embodiment of the present invention.

FIG. 5A is a cross-sectional view illustrating the device according to a third embodiment of the present invention. What makes the embodiment of FIG. 5A different from the embodiment of FIG. 1A is that a p+-type region 6 of an impurity concentration of about $1.0 \times 10^{17}$ cm$^{-3}$ is formed by diffusion in the drain region 3, and an n+-type region 17 of an impurity concentration of about $10^{20}$ cm$^{-3}$ is formed by diffusion in the region 6. The embodiment of FIG. 5A is the same as the embodiment of FIG. 1A with regard to all other respects.

Figure 5B:
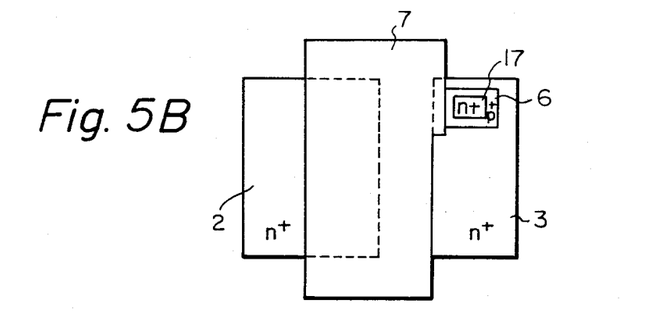

FIG. 5B is a plan view illustrating impurity regions 6 and 17 which are formed in the drain region 3. As will be obvious from FIG. 5B, the regions 6 and 17 are formed in only a small portion of the drain region 3. Further, as will be easily understood from FIG. 5A, the regions 6 and 17 are formed in the drain region so as to be isolated from the substrate, and the region 17 is formed in the region 6 so as to be isolated from the region 3. The pn junction surface between the region 6 and the drain region 3 is formed so as to be disposed beneath the floating gate 7, or so as to be in alignment with the end surfaces of the floating gate. Further, the source region 2 extends beneath the floating gate 7 to a point near the center thereof, thereby to form a capacitance between the source 2 and gate 7. Although not illustrated in FIG. 5B, the drain region 3 is provided with a drain electrode wiring which is similar to the wiring 10, so that a voltage and a current are supplied through the wiring.

Figure 6:
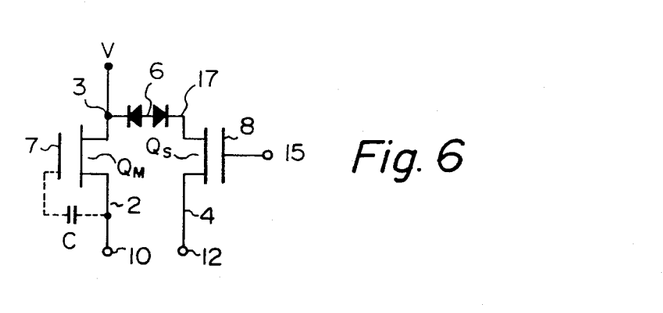
FIG. 6 illustrates an equivalent electric circuit of the device of FIGS. 5A and 5B.

The following is an explanation of the operation of the non-volatile memory device according to the third embodiment of the present invention with reference to the equivalent circuit of FIG. 6. The source electrode wiring 12 of the switching transistor $Q_S$ is grounded at all times. When information is to be erased, a positive voltage is applied to a gate wiring 15 of the transistor $Q_S$ so that it is rendered conductive, whereby any voltage applied to the drain 3 of the memory transistor $Q_M$ is also applied to the pn junction which is formed between the n-type region 3 and the p-type region 6. Here, the npn layer formed by the regions 3, 6, 17 constitutes a bipolar transistor with a floating base. As is well known, a breakdown voltage $V_B'$ between the region 3 and the region 17 becomes smaller thhan a breakdown voltage $V_B$ (approximately 10 volts) between the region 3 and the region 6, i.e. becomes smaller than 5 volts, in accordance with the following relation (1).

$$V_B' = V_B(1 - \alpha)^{\frac{1}{n}} \quad (1)$$

$$M = \frac{1}{1 - \left(\frac{V}{V_B}\right)^n} \quad (2)$$

where $\alpha$ represents a current amplification factor, M represents an avalanche multiplication coefficient in the junction between the region 3 and 6, and n represents a coefficient determined from the shape of the curve of voltage (V) vs. current (I) characteristics in the breakdown.

When a breakdown voltage (for instance of less than 5 volts) is applied to the drain 3 of the memory transistor $Q_M$, the avalanche breakdown develops. At this moment, if the source region 2 of the memory transistor is maintained at a positive voltage, the floating gate is also maintained at a positive potential owing to the capacitance C between the source region 2 and the floating gate 7. Consequently, hot electrons generated by the avalanche breakdown are injected into the floating gate 7. Therefore, any holes stored in the gate 7 disappear (the memory is erased) and the gate is negatively charged, so that the channel region of the transistor $Q_M$ is inverted into p-type. The channel region which is inverted into p-type causes the transistor $Q_M$ to be non-conductive; i.e., information is written. If the source region 2 of the memory transistor $Q_M$ is maintained at ground potential, the potential in the floating gate 7 approaches ground potential, so that hot holes generated by the avalanche breakdown are injected into the floating gate 7. Therefore, electrons stored in the gate disappear (the memory is erased) and the floating gate is positively charged, so that the channel region of the transistor $Q_M$ is inverted into n-type. The inversion into the n-type causes the transistor $Q_M$ to be conductive. Information can be written by injecting electric charge of either the positive polarity or the negative polarity into the floating gate 7. In this embodiment, however, let it be assumed that information "1" is written by injecting hot electrons, i.e. by rendering the transistor $Q_M$ non-conductive, and information is erased, or "0" is written, by injected hot holes, i.e. by rendering the transistor $Q_M$ conductive.

To read information, ground potential is applied to the gate wiring 15 of the transistor $Q_S$. The transistor $Q_S$, therefore, is rendered non-conductive. Accordingly, the positive voltage applied to the drain 3 of the memory transistor $Q_M$ is not applied to the pn junction formed between the region 3 and 6, and breakdown does not develop. The source 2 of the memory transistor $Q_M$ is kept at ground potential, and the turn on or turn off of the transistor $Q_M$, is read out by the positive voltage applied to the drain 3.

According to the present invention as illustrated above, the breakdown circuit is formed and is switched off by switching the potential of the n+-type region 17 formed in the drain region 3 of the memory transistor $Q_1$ between ground potential and the floated state. To read information, therefore, the breakdown circuit is switched off. Accordingly, no matter how small a withstand voltage in the pn junction formed by the region 3 and 6 is selected, the breakdown does not develop when information is being read, and the stored content is not affected. According to the present invention, furthermore, a bipolar transistor having a floating base is used as an element to store the electric charge. Consequently, the breakdown voltage for avalanche breakdown can be reduced to less than 5 volts, which is not obtainable with the pn junction of the embodiment of FIGS. 1A and B. In this embodiment, moreover, the source region 2 is used as a control electrode for writing and erasing information. In other words, since positive and negative charge can be injected to the control electrode, two modes of memory can be realized. Further, the device enables information to be easily erased electrically without the need of irradiating with ultraviolet rays, as is required by the conventional FAMOS devices. As required, furthermore, information may be partly erased with ease. Since the thermally nitrogenated film 13 has a very small thickness, the potential of the gate 7 can be controlled by a small voltage applied to the source region 2. According to the present invention, therefore, the voltage for writing and erasing information can be considerably decreased as compared with the conventionally employed voltages. Namely, a memory cell which operates at a voltage smaller than 5 volts can be realized without any special power source for writing information.

Although the above-mentioned embodiment uses a device having a thermally nitrified film as a gate insulation film of the memory transistor, it is, of course, allowable to employ any other insulation film. Further, although the source electrode is used as a control gate of the memory transistor, it is also allowable to place a separate control electrode on the insulation member on the floating gate, as is frequently done in the conventional devices. The control electrode may be eliminated when information is to be erased with ultraviolet rays, as is done with the conventional systems.

Figure 7A:
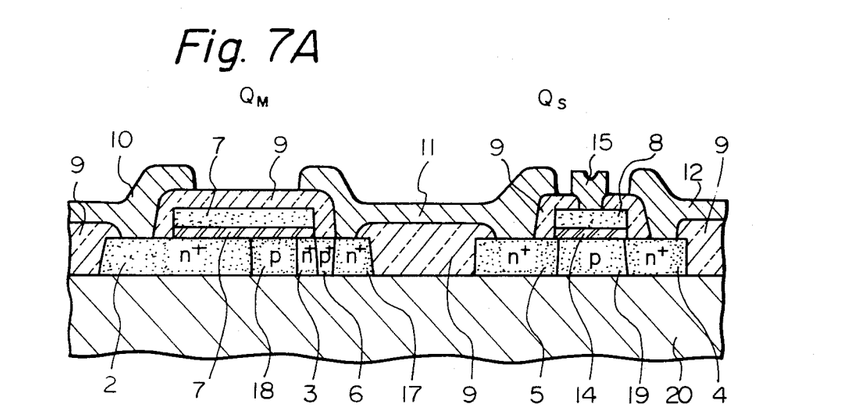
FIGS. 7A and 7B are a cross-sectional view and a plan view, respectively, of the device according to a fourth embodiment of the present invention.
Figure 7B:
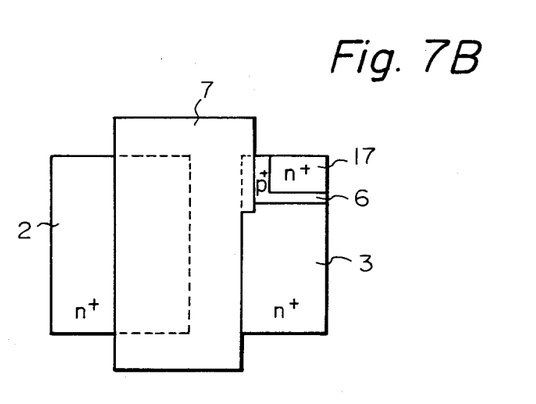

FIGS. 7A and 7B are a cross-sectional view and a plan view, respectively, when the above-mentioned construction is formed on an insulating sapphire substrate according to a further embodiment. In FIGS. 7A and 7B, the reference numeral 20 denotes a sapphire substrate. The silicon layer which is epitaxially grown on the substrate is formed into the shape of islands by etching. In the islands the source region 2 and the drain region 3 of the transistor $Q_M$, and the drain region 4 and the source region 5 of the transistor $Q_S$ are formed. Reference numerals 18 and 19 denote the above-mentioned silicon layers which are formed in the shape of islands, and which serve as channel regions. Other portions are the same as those of FIGS. 5A and 5B.

According to the present invention as will be understood from the foregoing description, a region of the opposite type of conductively to that of the drain region is formed contiguous to the drain region of the memory transistor, and the region of the opposite type of conductivity is selectively switched to ground potential or to the floating state, so as to form or to switch off the breakdown circuit respectively. When information is to be read, therefore, the breakdown circuit is switched off and the stored information is not adversely affected, even when the breakdown voltage in the junction between the drain region of the memory transistor and the region of the opposite type of conductivity contiguous to the drain region is low. Accordingly, it is possible to strikingly decrease the avalanche breakdown voltage as compared with the conventional devices. Further, when the source electrode of the memory transistor is to be used as a control electrode for writing and erasing information, the control electrode can be controlled by a small voltage, since the gate insulation film (thermally nitrified film) has a very small thickness, as mentioned already with reference to the aforementioned embodiments. Thus, with the device of the present invention, the voltage for writing and erasing information can be greatly decreased as compared with the voltages employed for the conventional devices, and the memory cells operate an a voltage of as small as 5 volts. Even when the memory device is formed as an integrated circuit, the device of the present invention operates to write, erase and read information by using a standard power source for integrated circuits of about 7 volts. Consequently, no specially designed power source is necessary, and the device can operate while consuming only a small amount of electric power.

What is claimed is:

1. A non-volatile memory cell comprising;
    a memory transistor which includes a floating gate into which information in the form of stored charge can be read, written and erased, and a source, a drain and a channel beneath said floating gate and between said source and said drain, said channel having conductivity type opposite to that of said source and drain;
    a first impurity region located in contact with said drain and electrically separated from said channel by said drain, said first impurity region having the same conductivity type as that of said channel;
    one end of said floating gate being located over said drain at a position near the boundary between said drain and said first impurity region so that hot carriers can reach said floating gate from said boundary for the writing and erasing of said information;
    avalanche means connected to said drain and to said first impurity region, for causing avalanche breakdown of the junction between said drain and first impurity region to provide said hot carriers for said writing and erasing of said information; and
    control means for controlling said avalanche means and the potentials of said source, drain and floating gate so that none of said hot carriers are provided when said information is being read;
    wherein said avalanche breakdown is caused for at least one of said writing and erasing of said information into said memory cell.

2. The cell of claim 1, wherein said device may be operated to read, write and erase said information with signals of less than 5 volts.

3. The cell of claim 1, wherein said avalanche means comprises a voltage supply connected to said drain.

4. The cell of claim 1, wherein said avalanche means comprises a second impurity region of the same conductivity type as said drain located in contact with said first impurity region, said first impurity region separating said second impurity region from said drain.

5. The device of claim 1, 3 or 4, said control means comprising an insulated control electrode formed over said floating gate for controlling said writing and erasing of said information.

6. The device of claim 3, said avalanche means comprising a switching transistor the drain of which comprises said first impurity region, wherein said first impurity region is placed in a non-floating state for said writing and erasing of information, and in a floating state for said reading of information.

7. The device of claim 1 or 4, wherein a portion of the boundary between said drain and said first impurity region is located under, or aligned with an edge of, said floating gate.

8. A semiconductor non-volatile memory device comprising:
    a memory transistor which has
        a first source region, a first drain region and a first channel region between said first source and drain regions, said first channel region being of the opposite conductivity type from that of said first source and drain regions,
        a first insulating film on said first channel region, and
        a floating gate on said first insulating film;
    a first impurity region contacting said first drain region in the vicinity of a portion of said floating gate so that energetic carriers can be provided to said floating gate, said first impurity region having electric conductivity type opposite to that of said first drain region, and said first impurity region being separated from said first channel region by said first drain region;
    a switching transistor which has
        a second source region, a second drain region and a second channel region between said second source and drain regions, said second channel region having opposite conductivity type from that of said second source and drain regions,
        a second insulating film on said second channel region, and
        a gate electrode on said second insulating film;
    wiring means connecting said first impurity region to said second drain region; and
    control means for controlling said switching transistor to keep said first impurity region in a grounded state when information is being written and erased and for controlling said switching transistor to keep said first impurity region in an electrically floating state when said information is being read, so that hot carriers are provided only when said information is being written and erased.

9. The device of claim 8, comprising a second impurity region of the same conductivity type as said first drain region located between said first impurity region and said wiring means, said second impurity region separating said wiring means from said first impurity region.

10. The device of claim 8 or 9, wherein said first source region extends beneath said floating gate to control the potential of said floating gate according to the capacitance therebetween and the potential that is applied to said first source region.

11. The device of claim 8 or 9, further comprising a third insulating film on said floating gate and a control gate on said third insulating film, wherein the potential of said floating gate can be controlled by said control gate according to the capacitance between said third insulating film and said floating gate and the potential of said control gate.

12. The device of claim 8 or 9, wherein said first and second source, drain and channel regions are formed in a semiconductor substrate, and said first and second impurity regions are formed within said first drain and first impurity regions, respectively.

13. The device of claim 8 or 9, wherein said first and second source, drain and channel regions are formed on an insulating substrate.

14. The device of claim 8 or 9, said first channel region having the same conductivity type as said second channel region.

* * * * *

UNITED STATES PATENT AND TRADEMARK OFFICE
CERTIFICATE OF CORRECTION

PATENT NO. : 4,491,859
DATED : 1 Jan. 1985
INVENTOR(S) : Shinpei Hijiya et al

It is certified that error appears in the above-identified patent and that said Letters Patent is hereby corrected as shown below:

On the title page;
(57) Line 2 - delete "a".

Column 2, line 3, "formation" should be --information--.

Column 5, line 25, "thhan" should be --than--

Column 6, line 5 "injected" should be --injecting--.

Signed and Sealed this

Sixth Day of August 1985

[SEAL]

*Attest:*

DONALD J. QUIGG

*Attesting Officer*  *Acting Commissioner of Patents and Trademarks*